(12) United States Patent
Ide et al.

(10) Patent No.: US 8,537,551 B2
(45) Date of Patent: Sep. 17, 2013

(54) SEMICONDUCTOR DEVICE INCLUDING SEMICONDUCTOR PACKAGES STACKED ON ONE ANOTHER

(75) Inventors: Shigeo Ide, Anjo (JP); Tomoo Iwade, Aichi-ken (JP)

(73) Assignee: Denso Corporation, Kariya (JP)

( * ) Notice: Subject to any disclaimer, the term of this patent is extended or adjusted under 35 U.S.C. 154(b) by 163 days.

(21) Appl. No.: 13/178,824

(22) Filed: Jul. 8, 2011

(65) Prior Publication Data
US 2012/0008282 A1 Jan. 12, 2012

(30) Foreign Application Priority Data

Jul. 9, 2010 (JP) .................................. 2010-157085
Feb. 28, 2011 (JP) .................................. 2011-041854

(51) Int. Cl.
*H05K 7/20* (2006.01)

(52) U.S. Cl.
USPC ........... 361/702; 361/704; 361/707; 361/709; 257/706; 257/707

(58) Field of Classification Search
None
See application file for complete search history.

(56) References Cited

U.S. PATENT DOCUMENTS

| | | | |
|---|---|---|---|
| 5,394,010 A | 2/1995 | Tazawa et al. | |
| 5,579,207 A | 11/1996 | Hayden et al. | |
| 6,952,046 B2 * | 10/2005 | Farrell et al. | 257/678 |
| 7,200,007 B2 * | 4/2007 | Yasui et al. | 361/716 |
| 7,245,493 B2 * | 7/2007 | Inagaki et al. | 361/699 |
| 7,724,523 B2 * | 5/2010 | Ishiyama | 361/699 |
| 7,835,151 B2 * | 11/2010 | Olesen | 361/689 |
| 7,940,526 B2 * | 5/2011 | Schulz-Harder et al. | 361/699 |
| 7,944,045 B2 * | 5/2011 | Noritake et al. | 257/712 |
| 7,965,508 B2 * | 6/2011 | Yamamoto et al. | 361/699 |
| 8,125,781 B2 * | 2/2012 | Mamitsu et al. | 361/702 |
| 8,363,403 B2 * | 1/2013 | Tonomoto | 361/699 |
| 2006/0096299 A1 | 5/2006 | Mamitsu et al. | |
| 2007/0085197 A1 * | 4/2007 | Arai et al. | 257/712 |

FOREIGN PATENT DOCUMENTS

| | | |
|---|---|---|
| JP | S60-179045 | 11/1985 |
| JP | 4-284661 | 10/1992 |
| JP | H08-148635 | 6/1996 |
| JP | 8-213543 | 8/1996 |
| JP | 2006-165534 | 6/2006 |
| JP | 2006-228834 | 8/2006 |
| JP | 4225310 | 12/2008 |

OTHER PUBLICATIONS

Japanese Office Action (2 pages) dated Nov. 9, 2012, issued in corresponding Japanese Application No. 2011-041854 with at least partial English translation (1 page).

* cited by examiner

*Primary Examiner* — Boris Chervinsky
(74) *Attorney, Agent, or Firm* — Nixon & Vanderhye P.C.

(57) ABSTRACT

The semiconductor device includes a plurality of semiconductor packages stacked on one another. Each semiconductor package includes a main current electrode terminal disposed in a case section of the semiconductor package, the main current electrode terminal being exposed outside the case section to be electrically connected to an external power supply. The main current electrode terminal extends in the stack direction of the semiconductor packages, and embedded in the case section at a surface portion thereof facing an external surface of the case section. Both end surface portions of the main current electrode terminal in the stack direction respectively reach end surface portions of the case section in the stack direction so that the main current electrode terminals of each adjacent two of the semiconductor packages are in contact with each other when the semiconductor packages are stacked on one another in the stack direction.

5 Claims, 5 Drawing Sheets

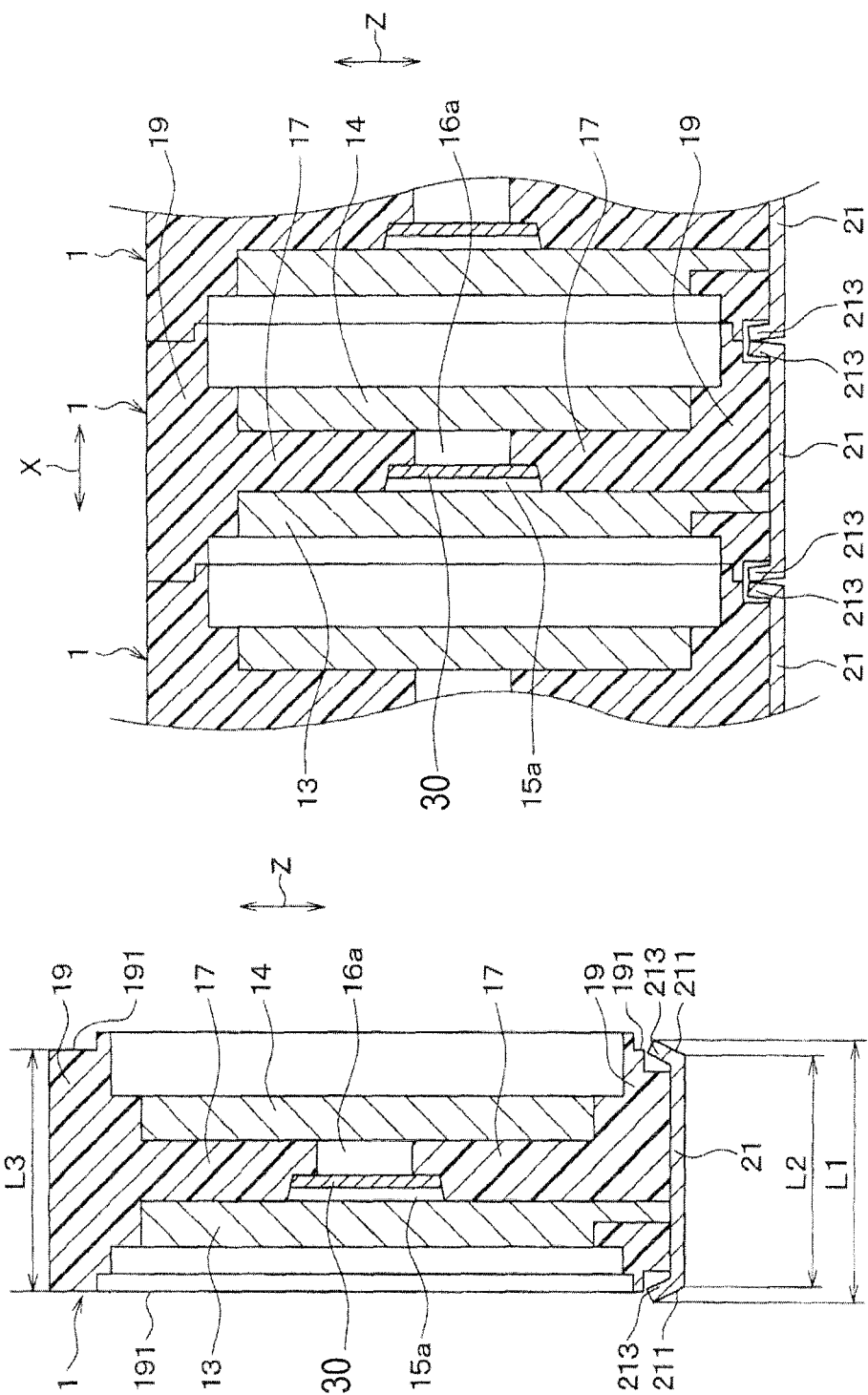

SEMICONDUCTOR DEVICE INCLUDING SEMICONDUCTOR PACKAGES STACKED ON ONE ANOTHER

This application claims priority to Japanese Patent Applications No. 2010-157085 filed on Jul. 9, 2010 and No. 2011-41854 filed on Feb. 28, 2011, the entire contents of which are hereby incorporated by reference.

BACKGROUND OF THE INVENTION

1. Field of the Invention

The present invention relates to a semiconductor device including a semiconductor package in which a semiconductor element and a metal body for heat dissipation are integrated which is cooled by coolant, and relates to a semiconductor device including a plurality of such semiconductor packages stacked on one another.

2. Description of Related Art

Generally such a semiconductor device includes a semiconductor package constituted of a semiconductor element, a metal body thermally connected to the semiconductor element to transfer heat from the semiconductor element, a seal section sealingly enclosing the semiconductor element and the metal body such that a heat dissipation surface of the metal body is exposed from the seal section, and a case section accommodating the seal section so as to form a coolant channel through which coolant flows. The semiconductor element and the metal body are disposed within the coolant channel, so that the heat dissipation surface of the metal body is cooled by the coolant.

Japanese Paten Application Laid-open No. 2006-165534 discloses stacking a plurality of such semiconductor packages such that one ends of main current terminals connected to the semiconductor elements and projecting outside from the case sections of the respective semiconductor packages are connected to a bus bar.

However, the above described conventional semiconductor device has a problem in that a bus bar has to be provided, and there are many portions which have to be welded or soldered. Further, since the current path between the bus bar and each of the main current terminals is long, the current path has a large inductance.

SUMMARY OF THE INVENTION

An embodiment provides a semiconductor device comprising:

a plurality of semiconductor packages stacked on one another, each semiconductor package including:

a semiconductor element;

a metal body thermally connected to the semiconductor element to transfer heat generated in the semiconductor element;

a case section shaped to form a coolant channel through which coolant flows and accommodating therein the semiconductor element and the metal body; and a main current electrode terminal disposed in the case section and electrically connected to the semiconductor element, the main current electrode terminal being exposed outside the case section to be electrically connected to an external power supply, wherein, when a direction in which the semiconductor packages are stacked is referred to as a stack direction, the main current electrode terminal extends in the stack direction, and embedded in the case section at a surface portion thereof facing an external surface of the case section, both end surface portions of the main current electrode terminal in the stack direction respectively reaching end surface portions of the case section in the stack direction so that the main current electrode terminals of each adjacent two of the semiconductor packages are in contact with each other when the semiconductor packages are stacked on one another in the stack direction.

According to the present invention, there is provided a semiconductor device including a plurality of semiconductor packages stacked on one another having a structure in which main current electrode terminals of the respective semiconductor packages can be electrically connected to one another without using a bus bar, and inductance of its main current path can be reduced.

Other advantages and features of the invention will become apparent from the following description including the drawings and claims.

BRIEF DESCRIPTION OF THE DRAWINGS

In the accompanying drawings:

FIG. 8A is a cross-sectional view of one of semiconductor packages before being stacked of a semiconductor device according to a second embodiment of the invention; and FIG. 8B is a cross-sectional view showing part of the semiconductor device constituted of the semiconductor packages stacked on one another according to the second embodiment of the invention.

PREFERRED EMBODIMENTS OF THE INVENTION

Figure 1:
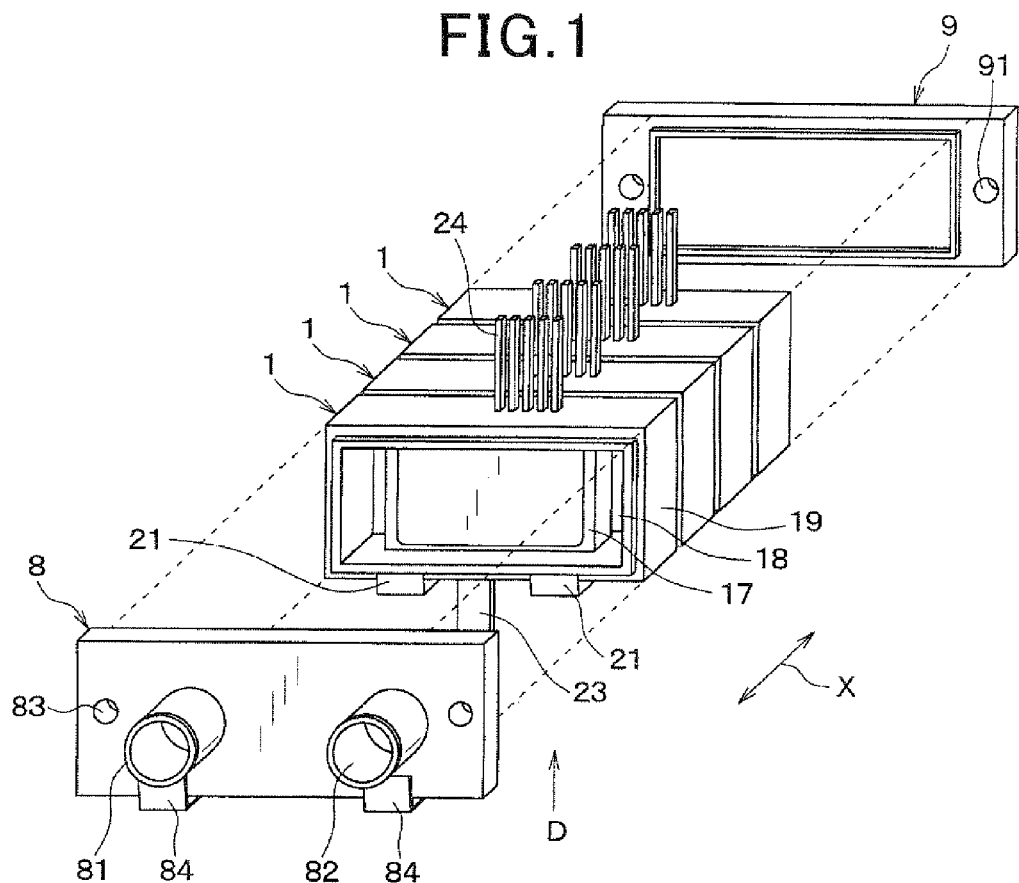
FIG. 1 is an exploded perspective view of a semiconductor device according to a first embodiment of the invention.
Figure 2:
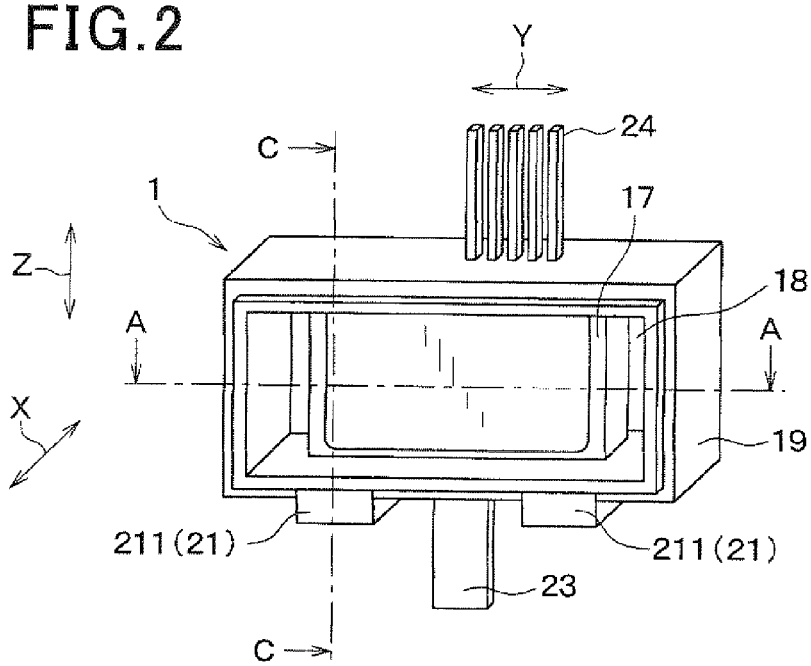
FIG. 2 is a perspective view of one of semiconductor packages included in the semiconductor device shown in FIG. 1.
Figure 3A:
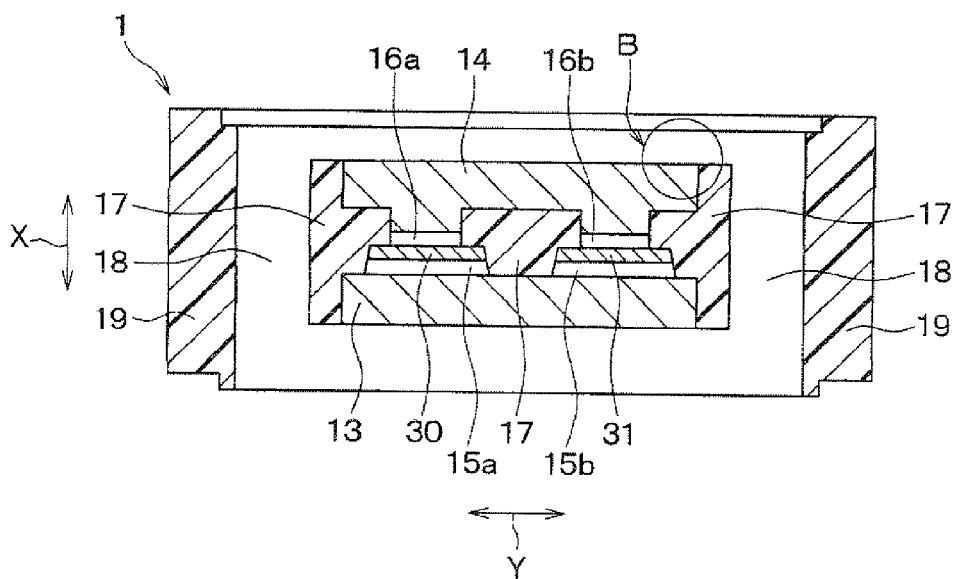
FIG. 3A is a cross-sectional view of FIG. 2 taken along the line A-A.
Figure 3B:
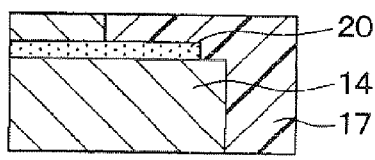
FIG. 3B is an enlarged cross-sectional view of part of FIG. 3A indicated by the line B.
Figure 4:
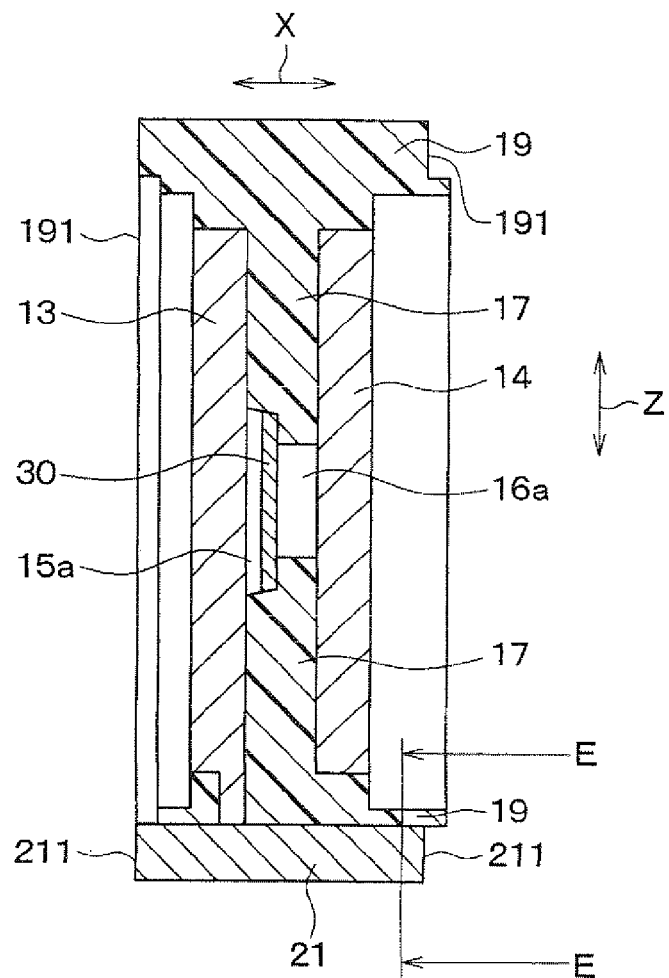
FIG. 4 is a cross-sectional view of FIG. 2 taken along the line C-C.
Figure 5:
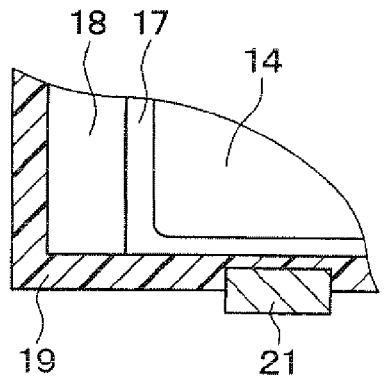
FIG. 5 is a cross-sectional view of FIG. 4 taken along the line E-E.
Figure 6:
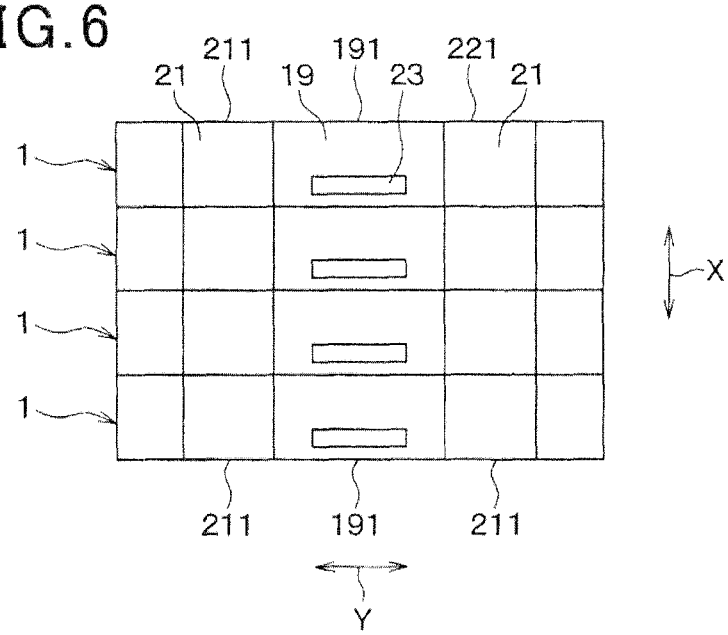
FIG. 6 is a perspective view of the semiconductor package shown in FIG. 1 as viewed from the arrow D.

In the below described embodiments, the same or equivalent parts or portions are designated by the same reference numerals or letters First Embodiment FIG. 1 is an exploded perspective view of a semiconductor device according to a first embodiment of the invention. FIG. 2 is a perspective view of one of semiconductor packages included in the semiconductor device shown in FIG. 1. FIG. 3A is a cross-sectional view of FIG. 2 taken along the line A-A. FIG. 3B is an enlarged cross-sectional view of part of FIG. 3A indicated by the line B. FIG. 4 is a cross-sectional view of FIG. 2 taken along the line C-C. FIG. 5 is a cross-sectional view of FIG. 4 taken along the line E-E. FIG. 6 is a perspective view of the semiconductor package shown in FIG. 1 as viewed from the arrow D.

The semiconductor device of the first embodiment includes a plurality of semiconductor packages 1 each having the 1 in 1 structure in which one semiconductor power element of an upper arm (a high-side element) is sealed in a seal section.

As shown in FIG. 1, the semiconductor packages 1 are stacked on one another as a semiconductor package stack. The semiconductor package stack is provided with a first lid member 8 at one end thereof, and a second lid member 9 at the other end thereof. The first and second lid members 8 and 9 are secured to each other by bolts (not shown) holding the semiconductor package stack therebetween. In the following, the direction in which the semiconductor packages 1 are stacked is referred to as the "stack direction X". As shown in FIGS. 2 to 6, the semiconductor package 1 includes a main semiconductor chip 30 formed with an IGET (Insulated Gate Bipolar Transistor) as a semiconductor power element, a sub semiconductor chip 31 formed with a FWD (Free Wheel Diode), a lower heat sink 13 made of metal, an upper heat sink 14 made of metal, a first lower solder portion 15a interposed between the main semiconductor chip 30 and the lower heat sink 13, a first upper solder portion 16a interposed between the main semiconductor chip 30 and the upper heat sink 14, a second lower solder portion 15b interposed between the sub semiconductor chip 31 and the lower heat sink 13, a second upper solder portion 16b interposed between the sub semiconductor chip 31 and the upper heat sink 14, a resin-made seal section 17 sealing therein the semiconductor chips 30 and 31 and the heat sinks 13 and 14, a resin-made case section 19 accommodating the seal section 7 so as to form a coolant channel 18 through which coolant flows, an insulating layers 20 formed on each of the surfaces of the heat sinks 13 and 14, two positive terminals 21, an output terminal 23, and control terminals 24.

The case section 19 is shaped in a tube having a rectangular cross section. Accordingly, the case section 19 appears as a rectangle when viewed from the stack direction X. In the following, the direction perpendicular to the stack direction X and parallel to the upper and lower outer surfaces of the case section 19 in FIG. 2 is referred to as the "width direction Y". Further, the direction perpendicular to the stack direction X and parallel to the left and right outer surfaces of the case section 19 in FIG. 2 is referred to as the "height direction Z".

The main semiconductor chip 30 and the sub semiconductor chip 31 are disposed side by side in the width direction Y. The seal section 17 is formed by applying resin to cover the semiconductor chips 30 and 31, and to fill the spaces between the heat sinks 13 and 14. The semiconductor chips 30 and 31, and the heat sinks 13 and 14 integrated as the seal section 17 of a roughly rectangular solid shape is accommodated in the case section 19 so as to be located within the coolant channel 18. The seal section 17 and the case section 19 are integrally molded using mold material such as epoxy resin.

The back surface of the main semiconductor chip 30 (the lower surface in FIG. 3A) and the upper surface of the lower heat sink 13 are joined to each other by the first lower solder portion 15a. The front surface of the main semiconductor chip 30 (the upper surface in FIG. 3A) and the lower surface of the upper heat sink 14 are joined to each other by the first upper solder portion 16a. Since the lower heat sink 13 and the upper heat sink 14 are thermally connected to the main semiconductor chip 30, the heat generated in the main semiconductor chip 30 is transferred to the heat sinks 13 and 14.

The back surface of the sub semiconductor chip 31 (the lower surface in FIG. 3A) and the upper surface of the lower heat sink 13 are joined to each other by the second lower solder portion 15b. The front surface of the sub semiconductor chip 31 (the upper surface in FIG. 3A) and the lower surface of the upper heat sink 14 are joined to each other by the second upper solder portion 16b. Since the lower heat sink 13 and the upper heat sink 14 are thermally connected to the sub semiconductor chip 31, the heat generated in the sub semiconductor chip 31 is transferred to the heat sinks 13 and 14.

Each of the main semiconductor chip 30 and the sub semiconductor chip 31 is formed with an electrode (not shown). The electrode of the main semiconductor chip 30 is electrically connected to the lower heat sink 13 through the first lower solder portion 15a. The electrode of the sub semiconductor chip 31 is electrically connected to the lower heat sink 13 through the second lower solder portion 15b.

The lower surface of the lower heat sink 13 serves as a heat dissipation surface. The upper surface of the upper heat sink 14 serves as a heat dissipation surface. These heat dissipation surfaces are exposed from the seal section 17 so that they are in contact with the coolant flowing through the coolant channel 18.

Hence, the heat generated in the main semiconductor chip 30 is dissipated by being transferred from its upper surface to the upper heat sink 14 through the first upper solder portion 16a, and from its lower surface to the lower heat sink 13 through the first lower heat sink 15a.

Likewise, the heat generated in the sub semiconductor chip 31 is dissipated by being transferred from its upper surface to the upper heat sink 14 through the second upper solder portion 16b, and from its lower surface to the lower heat sink 13 through the second lower heat sink 15b.

The upper and lower heat sinks 13 and 14 are made of a highly thermally conductive and highly electrically conductive material such as an aluminum alloy. Preferably, the upper and lower heat sinks 13 and 14 are shaped in a rectangular solid shape.

As shown in FIG. 3B, the insulating layer 20 is formed on the heat dissipation surface of the upper heat sink 14. Although not shown in the drawings, an insulating layer is formed also on the dissipation surface of the lower heat sink 13. The heat dissipation surfaces of the heat sinks 13 and 14 are electrically insulated from the semiconductor chips 30 and 31. Accordingly, the coolant may be electrically conductive liquid such as water.

The semiconductor device of this embodiment is used as a part of an inverter which converts DC power inputted thereto into AC power to drive an AC three-phase motor. More specifically, the inverter includes three pairs of the upper and lower arms connected in series corresponding to the three phases of the AC motor. The main semiconductor chip 30 and the sub microcomputer chip 31 constitute one of the upper arms in combination.

The positive terminal 21 as a main current electrode terminal is made of a highly electrically conductive material such as an copper alloy. The positive terminal 21 is shaped in a rectangular solid block extending in the stack direction X, and partially exposed outside the case section 19. More specifically, the two positive terminals 21 are disposed on one of the outer surfaces of the case section 19 on which the output terminal 23 is disposed. The positive terminal 21 is embedded in the case section 19 at its surface on the side facing the outer surface of the case section (the lower surface of the case section 19 in FIGS. 2 and 5), so as to project from the outer surface of the case section 19 at its surface on the side opposite to the outer surface of the case section 19. The positive terminal 21 is joined to the lower heat sink 13 by welding or soldering at its outer surface on the side facing the outer surface of the case section 19, so that it is electrically connected to the collector of the main semiconductor chip 30.

The positive terminal 21 has a positive terminal end surface portion 211 at each of the ends thereof in the stack direction X. Each positive terminal end surface portion 211 extends to reach a case section end surface portion 191 formed in each of both ends of the case section 19 in the stack direction X. More specifically, the outer surfaces of the positive terminal end surface portion 211 and the case section end surface portion 191 are flush with each other, and there is no step between them.

In this embodiment, the positive terminal 21 is provided at two places for each semiconductor package 1. However, the positive terminal 21 may be provided at one place for each semiconductor package 1.

The output terminal 23, which is a plate member made of a highly electrically conductive material such a copper alloy, is exposed outside the case section 19 to be electrically connected to a three-phase motor (not shown). The output terminal 23 is disposed on one of the outer surfaces on which the two positive terminal 21 are disposed, such that it is located between the two positive terminals 21 in the width direction Y. The output terminal 23 extends in the height direction Z. The output terminal 23 is joined to the upper heat sink 14 by welding or soldering to be electrically connected to the emitter of the main semiconductor chip 31.

The control terminals 24 include lead frames disposed at the periphery of the semiconductor chips 30 and 31 projecting outside the case section at their ends. More specifically, the control terminals 24 project from one of the outer surfaces of the case section 19 on which the positive terminals 21 are not disposed, and extend in the height direction Z.

The control terminals 24 are connected with a control circuit board of an external device at their end portions so that the semiconductor device is electrically connected to the control circuit board. The control terminals 24 serve as terminals connected to signal electrodes formed on the surfaces of the semiconductor chips 30 and 31 (gate electrodes, for example). Although not shown in the drawings, the control terminals 24 are electrically connected to the semiconductor chips 30 and 31 by bonding wires or the like.

As shown in FIG. 1, the first lid member 8 is a resin-made member of a roughly rectangular solid shape for closing one end of the semiconductor package stack. The first lid member 8 is provided with an inlet pipe 81 to introduce the coolant, and an outlet pipe 82 to discharge the coolant. The inlet pipe 81 and the outlet pipe 82 communicate with the coolant channel 18 of the semiconductor packages 1. The first lid member 8 is formed with through hole 83 as bolt holes.

The first lid member 8 is also provided with two positive relay terminals 84 made of a highly electrically conductive material such as a copper alloy. The positive relay terminals 84 are shaped to be in electrical contact with the positive terminals 21 when integrated to the semiconductor package stack.

The first lid member 8 may be made of an electrically conductive material such as a metal. In this case, the first lid member 8 is insulated from the positive relay terminals 84 by an insulating member interposed between the first lid member 8 and the positive relay terminals 8.

The second lid member 9 is a resin-made member of a roughly rectangular solid shape for closing the other end of the semiconductor package stack. The second lid member 9 is formed with female threads at two places with which bolts are engaged. Incidentally, the positive relay terminals 84 may be provided in the second lid member 9.

After the semiconductor packages 1 are stacked on one another, and the first and second lid members 8 and 9 are set at both ends of the semiconductor package stack, bolts are inserted through the through holes 83 formed in the first lid section 8, and engaged with the female threads 91 formed in the second lid member 91. As a result, the semiconductor package stack is securely held between the first and second lid members 8 and 9.

To ensure water tightness between each adjacent two of the semiconductor packages 1, between the first lid member 8 and the semiconductor package 1, and between the second lid member 9 and the semiconductor package 1, O-rings or adhesive materials are used as sealing members. In the case of using O-rings, the O-rings are pressed by the tightening force of the bolts.

In the state where the semiconductor package stack is held between the first and second lid members 8 and 9, the positive terminals 21 of each adjacent two of the semiconductor packages 1 are electrically connected with each other through their positive terminal end surface portions 211 being in contact with each other.

In this state, also each positive terminal 21 of the semiconductor package 1 adjacent to the first lid member 8 and each positive relay terminal 84 of the first lid member 8 are in contact with other to be electrically connected with each other.

Contact portions between the positive terminals 21 of each adjacent two of the semiconductor packages 1, and between each positive terminal 21 and each positive relay terminal 84 may be welded or soldered, or may be interposed with insulating films to ensure electrical connection at each of the contact portions.

When such contact portions are welded or soldered, the surface of the positive terminal end surface portion 211 and the surface of the case section end surface portion 191 may not be flush with each other. That is, in this case, the surface of the positive terminal end surface portion 211 may be indented in the stack direction X more than the surface of the case section end surface portion 191.

Further, the surface of the positive terminal end surface portion 211 may be projected in the stack direction X more than the surface of the case section end surface portion 191, so that electrical connection at the contact portions between the positive terminals 21 and between the positive terminal 21 and the positive relay terminal 84 are made more reliably when the semiconductor packages 1 are stacked on one another.

As described above, according to this embodiment, since the positive terminals 21 of each adjacent two of the semiconductor packages 1 are electrically connected with each other when the semiconductor packages 1 are stacked on one another, no bus bar for electrical connection among the positive terminals 21 of the semiconductor packages 1 is needed.

Further, it is not necessary to weld the contact portions between the positive terminals 21 of each adjacent two of the positive terminal 21. Even in the case where some of the contact portions are welded, the number of the welding portions can be reduced.

The surface of the positive terminal end surface portion 211 and the surface of the case section end surface portion 191 are flush with each other. Accordingly, no gap is formed between the case section end surface portions 191 of each adjacent two of the semiconductor packages stacked on one another.

The positive terminal 21 is embedded in the case section 19 at its surface on the side facing the outer surface of the case section 19. Accordingly, in combination with absence of a bus bar, since the length of the current path can be reduced, inductance of the current path can be reduced.

Modification of First Embodiment

Figure 7:
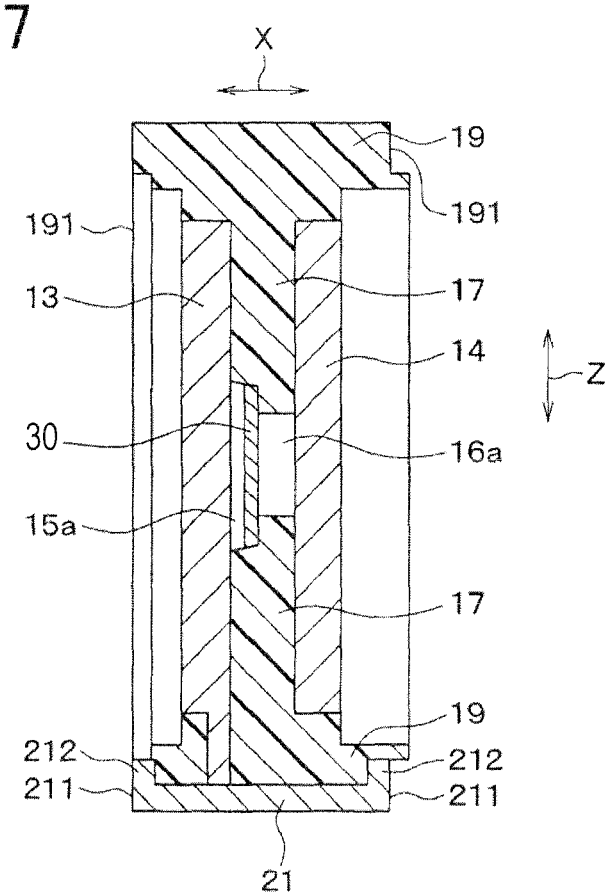
FIG. 7 is a cross-sectional view of one of semiconductor packages included in a modification of the semiconductor device according to the first embodiment of the invention.

FIG. 7 is a cross-sectional view of one of semiconductor packages included in a modification of the semiconductor device according to the first embodiment of the invention.

In the first embodiment, the positive terminal 21 is shaped as a rectangular solid. However, in this modification, the positive terminal 2 is made of a electrically conductive metal shaped to have a C-shaped cross section as shown in FIG. 7.

In this modification, the positive terminal 21 is bent at its both ends in the stack direction X so that bent portions 212 are formed at its both ends. The positive terminal 21 is embedded in the case section end surface portion 191 at portions each located between the case section end surface portions 191 of the case sections 19 of each adjacent two of the semiconductor packages 1 (that is, embedded in the case section end surface portion 191 at the bent portions 212). Embedding the bent portions 212 in the case section end surface portion 191 makes it possible to reduce the projection of the positive terminal end surface portions 211 from the case section end surface portion 191 to thereby reduce the gap between the case section end surface portions 191 of each adjacent two of the semiconductor packages 1, or to make the surface of the positive terminal end surface portion 211 and the surface of the case section end surface portion 191 flush with each other to thereby eliminate the gap between the case section end surface portions 191 of each adjacent two of the semiconductor packages 1.

Although the semiconductor device of the above embodiment is described as an upper arm of an inverter, this embodiment can be used as a lower arm of an inverter.

Second Embodiment

Next, a second embodiment of the invention is described. FIG. 8A is a cross-sectional view of one of semiconductor packages before being stacked of a semiconductor device according to a second embodiment of the invention. FIG. 8B is a cross-sectional view showing part of the semiconductor device constituted of the semiconductor packages stacked on one another according to the second embodiment of the invention. The following description of the second embodiment focuses on differences with the first embodiment.

As shown in FIG. 8A, in this embodiment, the positive terminal 21, which is made of a highly electrically conductive material such as a copper alloy, is bent at its both ends in the stack direction X to form two resilient portions 213 at its both ends.

When the length in the stack direction X between the distal ends of the resilient portions 213 in the free state is L1, the length in the stack direction X between the proximal ends of the two resilient portions 213 is L2, and the length between the surfaces of the case section end surface portions 191 of the semiconductor package 1 is L3, the relationship of L1>L3 and L1≦L3 holds.

When the first and second lid members 8 and 9 holding therebetween the semiconductor package stack are secured to each other by the bolts, the resilient portions 213 are elastically deformed so that the positive terminals 21 of each adjacent two of the semiconductor packages 1 are in contact with each other at their positive terminal end surface portions 211, and the case section end surface portions 191 of each adjacent two of the semiconductor packages 1 are in intimate contact with each other as shown in FIG. 8B.

According to the second embodiment, variations in the distances L1, L2 and L3 of the semiconductor packages 1 can be absorbed by the elastic deformation of the resilient portions 213. Hence, according to the second embodiment, since the positive terminals 21 of each adjacent two of the semiconductor packages 1 can be firmly contacted with each other when the semiconductor packages 1 are stacked on one another, it is possible to eliminate a gap between the case section end surface portions 191 of each adjacent two of the semiconductor packages 1 to thereby ensure seal of the coolant channel 18.

The above explained preferred embodiments are exemplary of the invention of the present application which is described solely by the claims appended below. It should be understood that modifications of the preferred embodiments may be made as would occur to one of skill in the art.

What is claimed is:

1. A semiconductor device comprising:
a plurality of semiconductor packages stacked on one another, each semiconductor package including:
a semiconductor element;
a metal body thermally connected to the semiconductor element to transfer heat generated in the semiconductor element;
a case section shaped to form a coolant channel through which coolant flows and accommodating therein the semiconductor element and the metal body; and
a main current electrode terminal disposed in the case section and electrically connected to the semiconductor element, the main current electrode terminal being exposed outside the case section to be electrically connected to an external power supply,
wherein, when a direction in which the semiconductor packages are stacked is referred to as a stack direction, the main current electrode terminal extends in the stack direction, and embedded in the case section at a surface portion thereof facing an external surface of the case section, both end surface portions of the main current electrode terminal in the stack direction respectively reaching end surface portions of the case section in the stack direction so that the main current electrode terminals of each adjacent two of the semiconductor packages are in contact with each other when the semiconductor packages are stacked on one another in the stack direction.

2. The semiconductor device according to claim 1, wherein the end surface portions of the main current electrode terminal project beyond the end surface portions of the case section in the stack direction.

3. The semiconductor device according to claim 1, wherein each of the end surface portions of the main current electrode terminal is flush with a corresponding one of the end surface portions of the case section.

4. The semiconductor device according to claim 1, wherein each of the main current electrode terminals of the semiconductor packages is embedded in the case section at a portion thereof located between the end surface portions of the case sections of each adjacent two of the semiconductor packages.

5. The semiconductor device according to claim 1, wherein the end surface portions of the main current terminal are formed with a resilient portion elastically deformable in the stack direction.

* * * * *